(12) United States Patent
Hashimoto et al.

(10) Patent No.: US 6,261,378 B1
(45) Date of Patent: Jul. 17, 2001

(54) SUBSTRATE CLEANING UNIT AND CLEANING METHOD

(75) Inventors: Hiroshi Hashimoto; Yoshitaka Matsuda, both of Kumamoto; Norio Uchihira, Tamana-gun; Masaaki Yoshida, Kamoto-gun; Fumio Satou, Kikuchi-gun, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/272,314

(22) Filed: Mar. 19, 1999

(30) Foreign Application Priority Data

Mar. 23, 1998 (JP) .................................................. 10095355

(51) Int. Cl.$^7$ .............................. B08B 7/00; A47L 25/00
(52) U.S. Cl. .................................. 134/6; 134/26; 134/32; 134/33; 134/34; 134/902; 15/77; 15/97.1; 15/102
(58) Field of Search ................................ 134/1, 1.3, 2, 3, 134/6, 18, 26, 902, 102.1, 95.1, 99.1, 32, 33, 34; 15/97.1, 77, 102, 302

(56) References Cited

U.S. PATENT DOCUMENTS

| | | | |
|---|---|---|---|
| 5,351,360 | * | 10/1994 | Suzuki et al. ..................... 134/902 X |
| 5,368,054 | * | 11/1994 | Koretski et al. ..................... 134/153 |
| 5,375,291 | * | 12/1994 | Tateyama et al. ..................... 15/302 |
| 5,562,772 | * | 10/1996 | Neoh ............................... 134/902 X |
| 5,651,160 | * | 7/1997 | Yonemizu et al. .................... 15/302 |
| 5,723,019 | * | 3/1998 | Krusell et al. ......................... 134/6 |
| 5,785,068 | * | 7/1998 | Sasaki et al. ........................ 134/144 |
| 5,858,109 | * | 1/1999 | Hymes et al. .......................... 134/2 |
| 5,858,112 | * | 1/1999 | Yonemizu et al. ....................... 134/6 |
| 6,059,891 | * | 5/2000 | Kubota et al. ......................... 134/18 |
| 6,093,254 | * | 7/2000 | Svirchevski et al. ..................... 134/2 |
| 6,106,635 | * | 8/2000 | Hamada et al. ....................... 134/33 |

* cited by examiner

Primary Examiner—Alexander Markoff
(74) Attorney, Agent, or Firm—Rader, Fishman & Grauer, PLLC

(57) ABSTRACT

A cleaning unit for cleaning a substrate is disclosed, that comprises a holding mechanism for rotatably and horizontally holding the substrate, a first traveling means for holding both sides of a cleaning mechanism having at least one cleaning member and for moving the cleaning mechanism in such a manner that the first traveling means is kept in parallel with the substrate held by the holding mechanism, and a second traveling means for holding both sides of a processing solution supplying mechanism having supplying mechanisms for supplying different types of processing solution and for moving the cleaning mechanism in such a manner that the second traveling means is kept in parallel with the substrate held by the holding mechanism. Thus, the strength of the cleaning unit according to the present invention is higher than the strength of a conventional cleaning unit that holds an arm on one side thereof. In addition, a process of a cleaning mechanism and a process of a supplying mechanism can be equally performed on the entire surface of the substrate.

25 Claims, 11 Drawing Sheets

SUBSTRATE CLEANING UNIT AND CLEANING METHOD

BACKGROUND OF THE INVENTION

1. Field of the Invention

The present invention relates to a cleaning unit and a method for cleaning a substrate such as a liquid crystal display (LCD) glass substrate or a semiconductor wafer.

2. Description of the Related Art

Generally, when a liquid crystal display is fabricated a sequence of processes using photolithography technology is used for forming an ITO (Indium Tin Oxide) thin film and an electrode pattern on a LCD substrate (glass substrate) in the same manner as the fabrication of semiconductor devices. In the photolithography process, a circuit pattern is reduced. The reduced circuit pattern is transferred to photoresist. The resultant photoresist is developed.

In such a sequence of processes, resist solution is coated on a glass substrate. Thereafter, an exposing process and a developing process are performed. Before such processes are performed, it is necessary to clean the front surface of the glass substrate on which the resist solution is coated so as to prevent a defective circuit pattern, wiring short-circuit, out-of-focus state in the exposing process, and particles from taking place.

Thus, in a resist coating and developing system, a cleaning unit is disposed. In a conventional cleaning unit, an arm is disposed on one side of a glass substrate held by a holding means such as a spin chuck. While the glass substrate is rotated, a brush or a nozzle disposed at the edge of the arm is moved to an upper position of the upper surface of the glass substrate so as to clean the front surface of the substrate. The cleaning operation using the brush is referred to as scrubber cleaning operation. The cleaning operation using the nozzle is referred to as mega-sonic cleaning operation.

However, in the conventional cleaning unit, since the arm is held on one side thereof, the strength of the cleaning unit is weak. In particular, as the size of LCD panels becomes large, the cleaning area becomes large. Thus, the length of the arm should be increased. However, when the length of the arm becomes large, the arm further weakens. Moreover, in most conventional cleaning units, only one brush or nozzle is disposed at the edge of the arm. Thus, the cleaning areas of the conventional cleaning units are not wide. In other words, it takes a long time to clean the entire front surface of a glass substrate.

SUMMARY OF THE INVENTION

An object of the present invention is to provide a cleaning means that is stronger than a conventional cleaning means.

A first aspect of the present invention is a cleaning unit for cleaning a substrate, comprising a holding mechanism for rotatably and horizontally holding the substrate, a first traveling means for holding both sides of a cleaning mechanism having at least one cleaning member and for moving the cleaning mechanism in such a manner that the first traveling means is kept in parallel with the substrate held by the holding mechanism, and a second traveling means for holding both sides of a processing solution supplying mechanism having supplying mechanisms for supplying different types of processing solution and for moving the cleaning mechanism in such a manner that the second traveling means is kept in parallel with the substrate held by the holding mechanism. Thus, the process of a cleaning mechanism and the process of a processing solution supplying mechanism can be equally performed for the entire area of the substrate. Consequently, the size of the cleaning means can be increased for large glass substrates that are currently available and those that will be available in future. Thus, the cleaning area can be widened. Consequently, the yield of the substrates can be improved.

A second aspect of the present invention is a method for cleaning a substrate, comprising the steps of (a) moving a cleaning member on the front surface of the substrate in such a manner that the cleaning member is kept in parallel with the substrate that is horizontally held and that the cleaning member pressures the front surface of the substrate with a predetermined pressure so as to clean the front surface of the substrate, and (b) causing a processing solution supplying member to travel on the front surface of the substrate and supply different types of processing solution to the front surface of the substrate at a time in such a manner that the processing solution supplying member is kept in parallel with the substrate so as to clean the front surface of the substrate. Thus, the cleaning process can be equally performed for the entire area of a processing surface of the substrate. The equality of the process can be maintained for large glass substrates that are currently available and those that will be available in future. Consequently, the yield for the entire surface of the substrate or the yield against an error among each substrate can be improved.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

Next, as a preferred embodiment of the present invention, the structure of a cleaning unit for use with a resist processing system that forms photoresist on the front surface of a glass substrate G (here in after referred to as substrate G) of a liquid crystal display (LCD) will be described. It should be noted that the present invention is not limited to a glass substrate G. Instead, the present invention can be applied to plate-shaped substrates such as semiconductor wafers.

Figure 1:
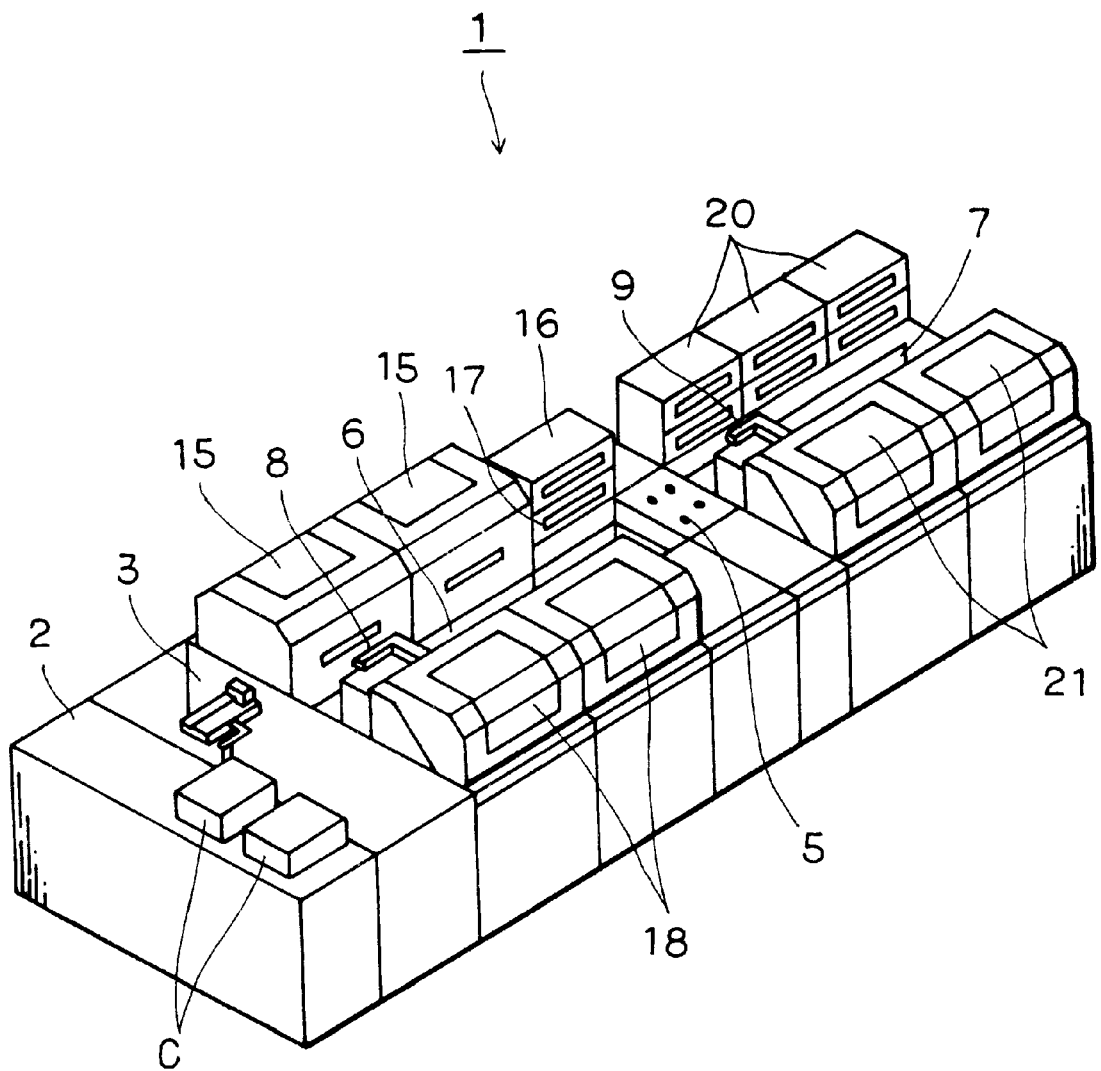
FIG. 1 is a perspective view showing the structure of a resist processing system having a cleaning unit according to an embodiment of the present invention.

FIG. 1 is a perspective view showing the structure of the resist processing system 1 having a cleaning unit 15 according to an embodiment of the present invention. A carrier stage 2 is disposed at the front row of the resist processing system 1. The carrier stage 2 holds a carrier C that accommodates a plurality of substrates G. At the rear of the carrier stage 2, a loading/unloading unit 3 is disposed. The loading/unloading unit 3 loads and unloads a substrate G to and from a carrier C in the carrier stage 2. At the center of the resist processing system 1, two conveying paths 6 and 7 are disposed in series with a relaying portion 5. Conveying arms 8 and 9 convey a substrate G to the conveying paths 6 and 7.

On both the sides of the conveying path 6, two cleaning units 15, an adhesion unit 16, a cooling unit 17, and two coating units 18 are disposed. On both the sides of the conveying path 7, a plurality of baking units 20 and two developing units are disposed. When required, an exposing unit (not shown) is connected to the rear of the resist processing system 1.

In the resist processing system 1, the loading/unloading unit 3 extracts a substrate G from a carrier C placed in the carrier stage 2. The extracted substrate G is transferred from the loading/unloading unit 3 to the conveying arm 8. The conveying arm 8 conveys the substrate G to the cleaning unit 15 along the conveying path 6. The cleaning unit 15 performs the scrubber cleaning operation or the nozzle cleaning operation for the substrate G. Thereafter, the conveying arm 8 conveys the substrate G to the adhesion unit 16. The adhesion unit 16 performs a hydrophobic process for the substrate G. Next, the cooling unit 17 cools the substrate G. The conveying arm 8 conveys the substrate G to the coating unit 17. The coating unit 17 coats a photoresist film (namely, a photosensitive film) on the front surface of the substrate G. Thereafter, the conveying arm 8 transfers the substrate G to the conveying arm 9 through the relaying portion 5. The conveying arm 9 conveys the substrate G to the baking unit 20. The baking unit 20 performs a pre-baking process for heating the photoresist film on the substrate G. The conveying arm 9 conveys the substrate G to an exposing unit (not shown). The exposing unit exposes a predetermined pattern on the substrate G. Thereafter, the conveying arm 9 conveys the resultant substrate G to the developing unit 21. The developing unit 21 develops the substrate G. The resultant substrate G is returned back to a relevant carrier C through the conveying arm 9, the relaying portion 5, and the conveying arm 8.

Figure 2:
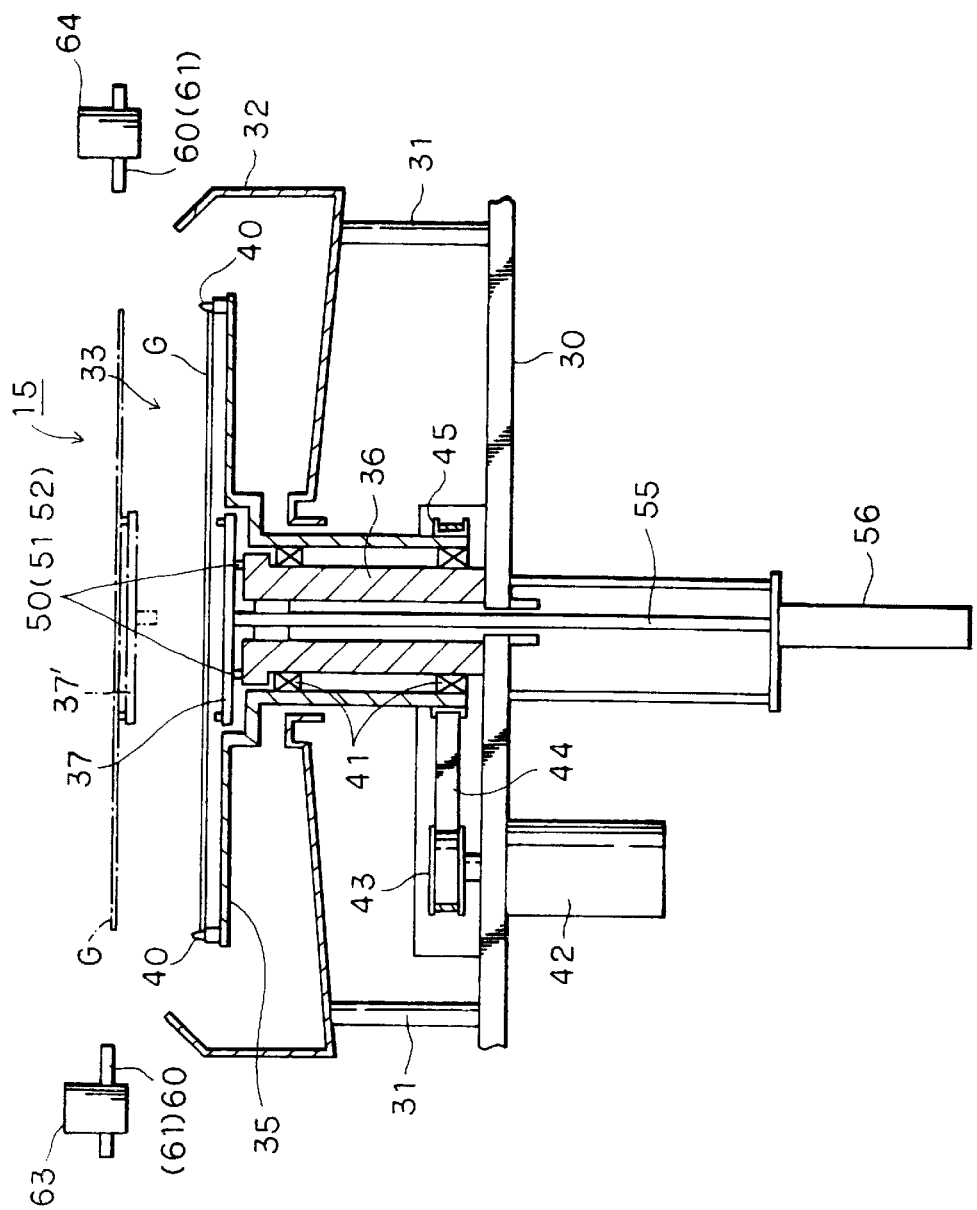
FIG. 2 is a vertical sectional view showing the structure of the cleaning unit shown in FIG. 1.
Figure 3:
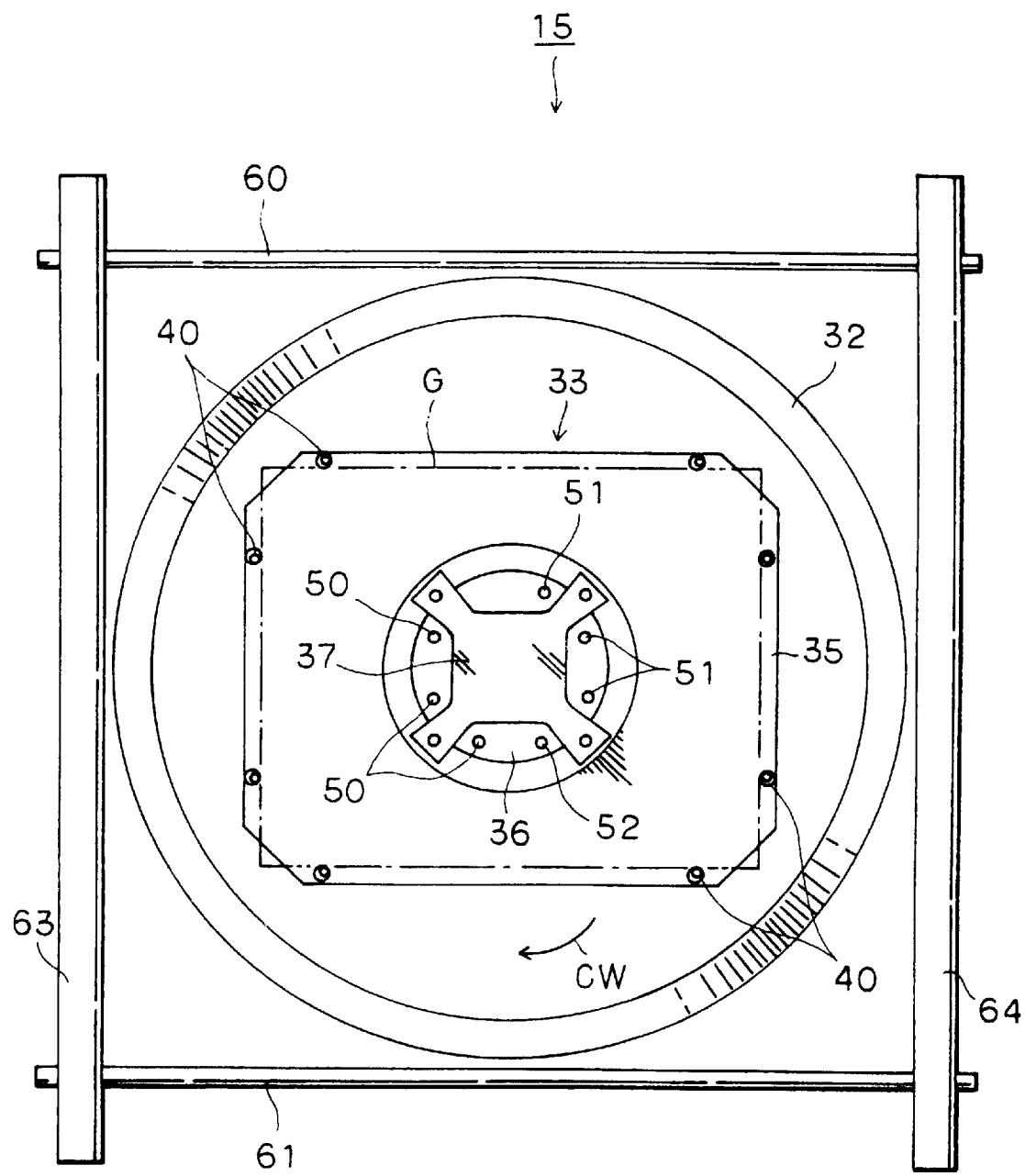
FIG. 3 is a plan view showing the structure of the cleaning unit shown in FIG. 1.

Next, the structure of the cleaning unit 15 according to the embodiment of the present invention will be described. FIG. 2 is a vertical sectional view showing the structure of the cleaning unit 15. FIG. 3 is a plan view showing the structure of the cleaning unit 15.

Pillars 31 are disposed on the upper surface of a table 30. A cup 32 is held at the upper edges of the pillars 31. The cup 32 is formed in a top-opened cylinder shape. A holding means 33 as a holding mechanism that horizontally holds the substrate G is disposed in the cup 32. In the example shown in FIG. 2, the holding means 33 has a spin chuck portion 35, a pillar portion 36, and a lifting portion 37.

A plurality of pins 40 are formed on the upper surface of the spin chuck portion 35. The pins 40 align and hold the substrate G. The spin chuck portion 35 is rotatably held by the pillar portion 36 through bearings 41. A motor 42 is disposed on the lower surface of the table 30. The rotating force of the motor 42 is transmitted to the spin chuck portion 35 through a pulley 43, a belt 44, and a pulley 45. Thus, the spin chuck portion 35 is rotated and thereby the substrate G held on the upper surface of the spin chuck portion 35 is rotated in the clockwise direction (direction CW denoted by arrow shown in FIG. 3).

A rear surface processing solution supplying mechanism and an air supplying mechanism are disposed on the upper surface of the pillar portion 36. The rear surface processing solution supplying mechanism is composed of a plurality of nozzles (for example three nozzles 50 and three nozzles 51) that supply cleaning solution to the rear surface of the substrate G held by the spin chuck portion 35. The air supplying mechanism is composed of one nozzle 52 that supplies dry gas to the center direction of the rear surface of the substrate G. The nozzles 50 supply pure water as rise cleaning solution. The nozzles 51 supply a chemical solution other than pure water. Examples of the chemical a solution are surface active agent (that prevents static electricity), a solution containing surface active agent, and a solvent (that dissolves the resist). The nozzle 52 supplies a dry gas (for example, $N_2$ gas). The solution supplied from the nozzles 50 or 51 can be independently selected. Thus, the solution is simultaneously or selectively supplied from the nozzles 50 or 51.

Figure 4:
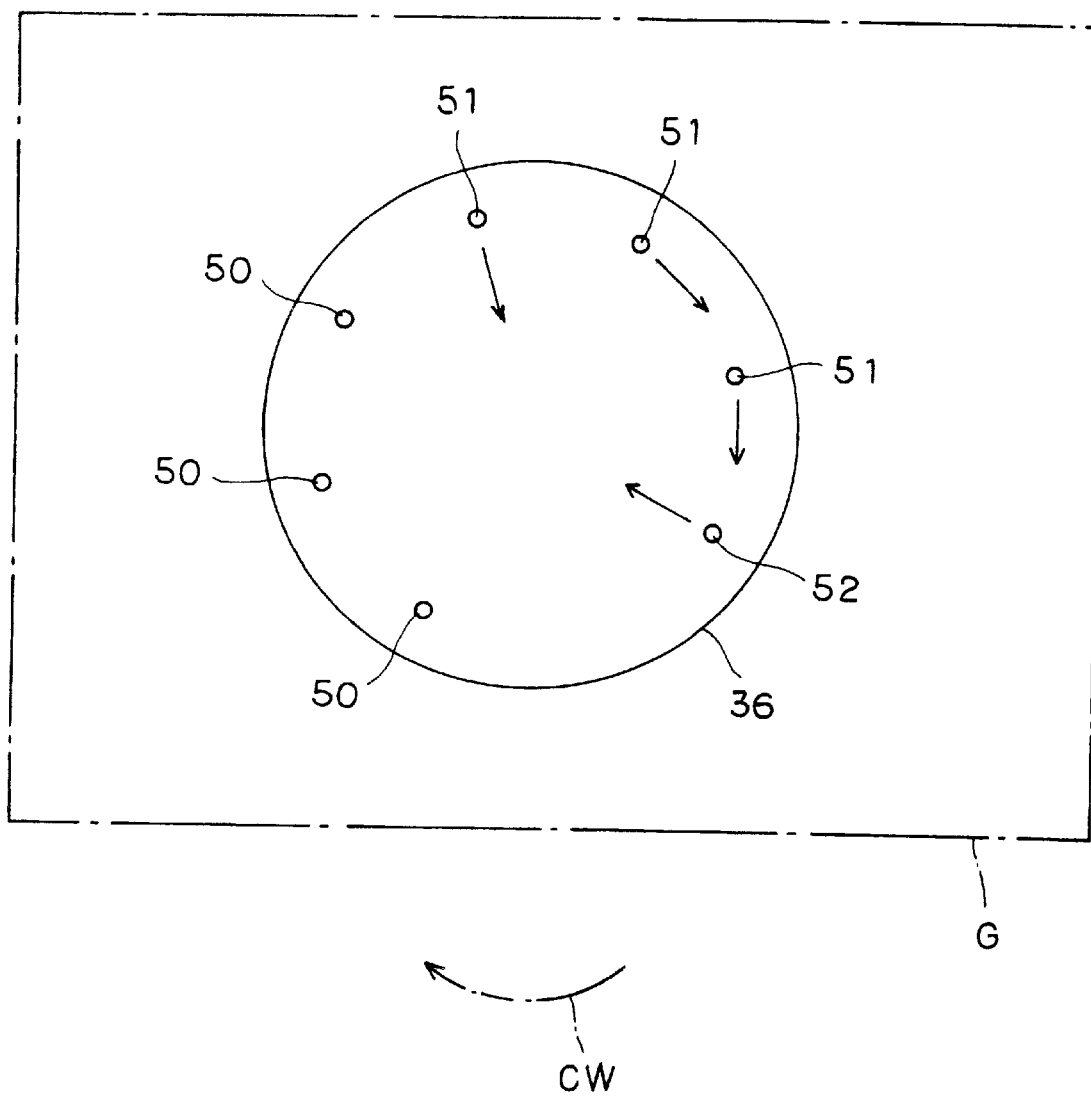
FIG. 4 is a schematic diagram for explaining the orientations of nozzles disposed on the upper surface of a pillar portion.

The orientations of the nozzles 50, 51, and 52 can be varied. In this embodiment, as shown in FIG. 4, one of the nozzles 50 orients to the center direction of the rear surface of the substrate G held by the spin chuck portion 35. The other two nozzles 50 orient in the rotating direction CW of the substrate G. Likewise, one of the nozzles 51 orients to the center direction of the rear surface of the substrate G. The other two nozzles 50 orient to the rotating direction CW of the substrate G. The nozzle 52 orients to the center direction of the rear surface of the substrate G.

The lifting portion 37 is held at the upper edge of a piston rod 55 that pierces the center of the pillar portion 36. When the cylinder 56 is operated, the piston rod 55 is extended or retracted. Thus, the lifting portion 37 is raised and lowered. A lifting portion 37' denoted by a dotted line shown in FIG. 2 represents that the cylinder 56 is extended and thereby the lifting portion 37 is raised. When the substrate G is loaded or unloaded, the lifting portion 37 is raised. In this state, the conveying arm 8 transfers the substrate G to the spin chuck portion 35 in the cleaning unit 15 or vice versa. In contrast, the lifting portion 37 denoted by a solid line shown in FIG. 2 represents that the cylinder 56 is shrunk and thereby the lifting portion 37 is lowered. Thus, when the lifting portion 37 is lowered, the substrate G transferred from the conveying arm 8 is aligned with the pins 40 and held on the upper surface of the spin chuck portion 35.

A pair of guides 60 and 61 are disposed in parallel with the holding means 33 above the cup 32. In addition, a scrubber cleaning means 63 (as a cleaning means) and a nozzle cleaning means 64 (as a processing solution supplying means) are disposed so that they are reciprocally traveled along the guides 60 and 61. The scrubber cleaning means 63 and the nozzle cleaning means 64 shown in FIGS. 2 and 3 are independently moved. FIG. 3 shows a standby state of the scrubber cleaning means 63 and the nozzle cleaning means 64 that are placed outside the cup 32. In the standby state, the scrubber cleaning means 63 and the nozzle cleaning means 64 are positioned on the left and the right of the holding means 33, respectively.

The scrubber cleaning means 63 has disc brushes or a roll brush.

Figure 5:
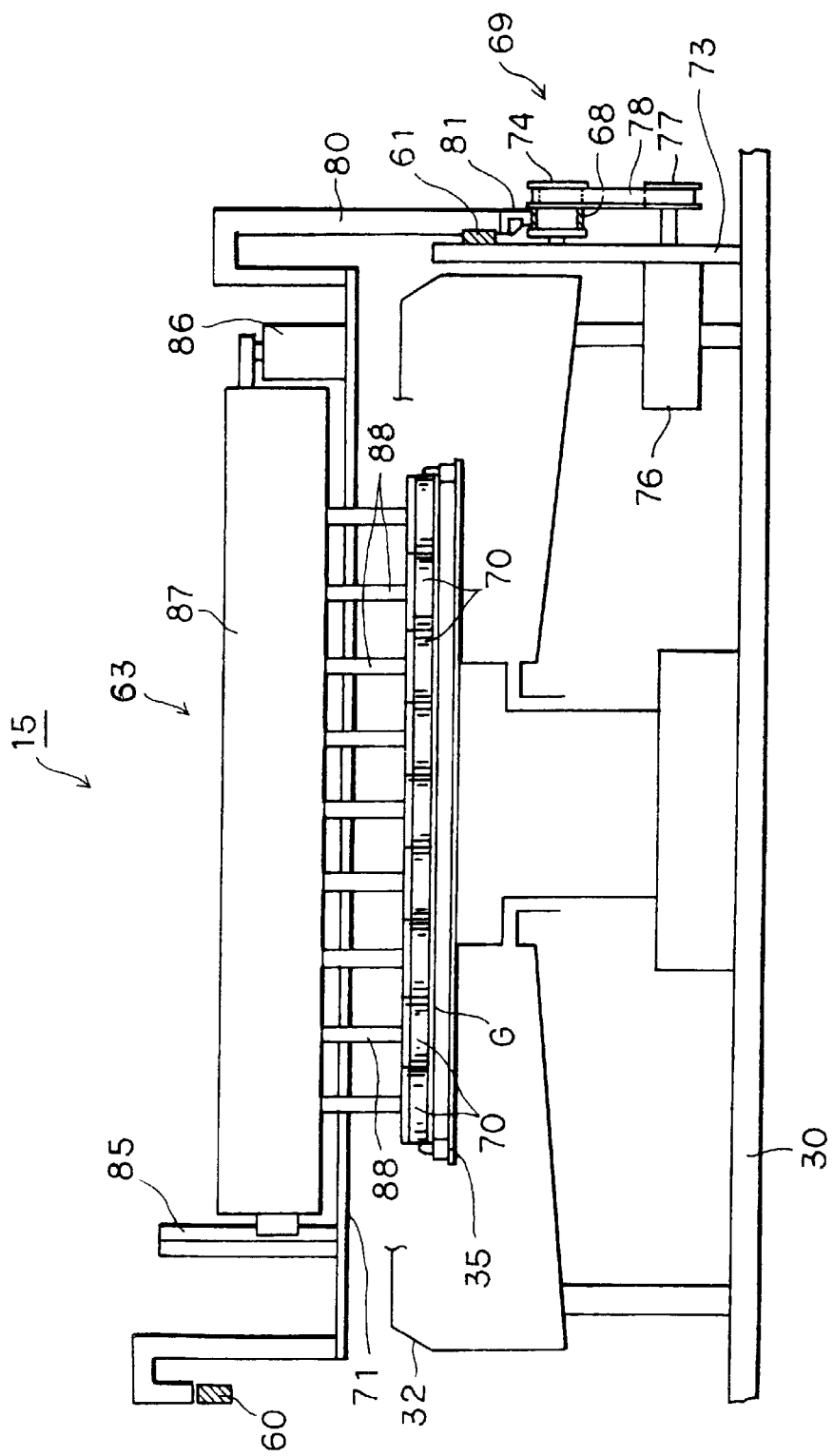
FIG. 5 is a left side view showing the structure of a cleaning unit having a scrubber cleaning means with disc brushes for cleaning the front surface of a substrate according to another embodiment of the present invention.

FIG. 5 is a left side view showing the structure of a cleaning unit 15 having a scrubber cleaning means 63 with many cleaning members such as disc brushes 70. The scrubber cleaning means 63 cleans the front surface of the substrate G with the disc brushes 70. A traveling member 71 traverses the cup 32. The traveling member 71 is held by guides 60 and 61 disposed on both sides of the cup 32 so that the traveling member 71 is reciprocally moved. A reciprocal traveling mechanism 69 is disposed as a first traveling means in the vicinity of the guide 61 so as to reciprocally move the traveling member 71 along the guides 60 and 61. In other words, the reciprocal traveling mechanism 69 has a two-staged pulley 74 and an endless belt 68. The two-staged pulley 74 is disposed on a holding member 73. The holding member 73 is disposed on the table 30. The endless belt 68 is wound around a pulley 75 shown in FIG. 6. The rotating force of a motor 76 is transmitted to the endless belt 68 through a pulley 77, a belt 78, and the two-staged pulley 74. As shown in FIG. 5, the traveling member 71 is connected to the upper surface of the endless belt 68 through a connecting member 80 and a bracket 81. Thus, corresponding to the forward/backward rotations of the motor 76, the entire scrubber cleaning means 63 is reciprocally moved along the guides 60 and 61.

A vertical guide 85 and a cylinder 86 are disposed on the upper surface of the traveling member 71. Both sides of a scrubber main body 87 are held by the vertical guide 85 and the cylinder 86. Many rotating shafts 88 are disposed on the lower surface of the scrubber main body 87. The rotating shafts 88 are rotated by the rotating force of a motor disposed in the scrubber main body 87. Disc brushes 70 are disposed at lower edges of the rotating shafts 88. When the cylinder 86 is shrunk, the scrubber main body 87 is lowered. Thus, the disc brushes 70 contact the front surface of the substrate G held on the upper surface of the spin chuck portion 35 in the cup 32. FIG. 5 shows the state that after the cylinder 86 is shrunk and thereby the scrubber main body 87 is lowered, the disc brushes 70 contact the front surface of the substrate G. As will be described later, when the scrubber cleaning means 63 is moved from the standby position to the inside of the cup 32 or vice versa, the cylinder 86 is extended and thereby the scrubber main body 87 is raised. Thus, the disc brushes 70 are raised to a position higher than the opening portion of the cup 32.

Figure 7:
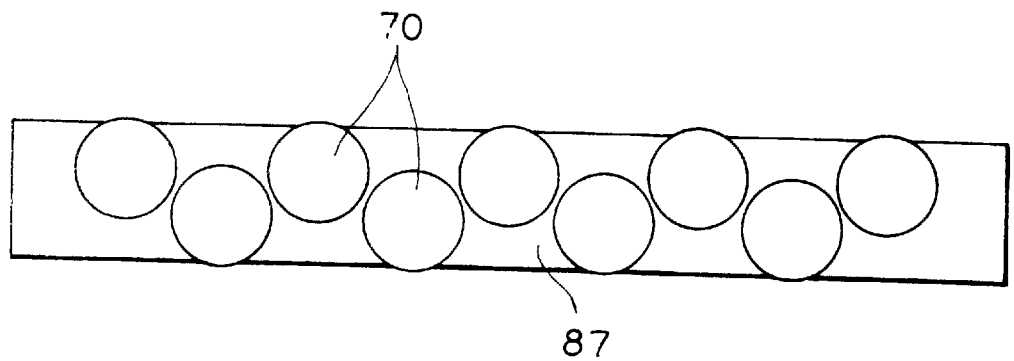
FIG. 7 is a bottom view showing the structure of a scrubber main body shown in FIG. 5.

As shown in FIG. 7, the disc brushes 70 are closely arranged on the lower surface of the scrubber main body 87. When the front surface of the substrate G is cleaned, the cylinder 86 is shrunk and thereby the scrubber main body 87 is lowered. Thus, in the state that the disc brushes 70 contact the front surface of the substrate G with a predetermined pressure, while the disc brushes 70 are rotated, the motor 76 is rotated forward and backward. Thus, the scrubber cleaning means 63 is reciprocally moved along the guides 60 and 61. Consequently, the entire front surface of the substrate G can be cleaned.

Figure 8:
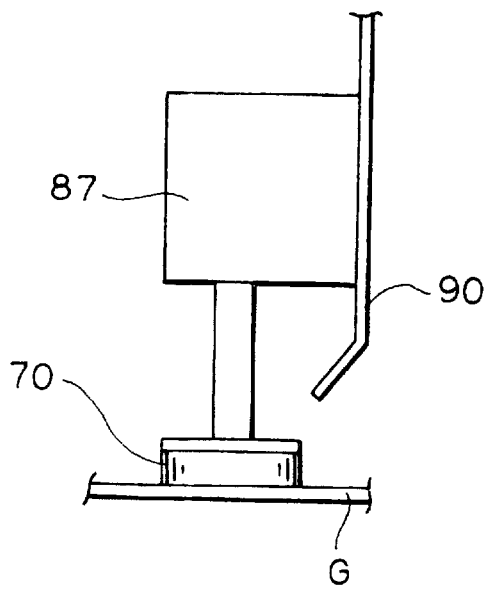
FIG. 8 is a side view showing the structure of the scrubber main body shown in FIG. 5.

In addition, as shown in FIG. 8, nozzles 90 are disposed on one side of the scrubber main unit 87. When the disc brushes 70 are rotated, a cleaning solution such as pure water is sprayed from the nozzles 90 to the front surface of the substrate G.

Figure 6:
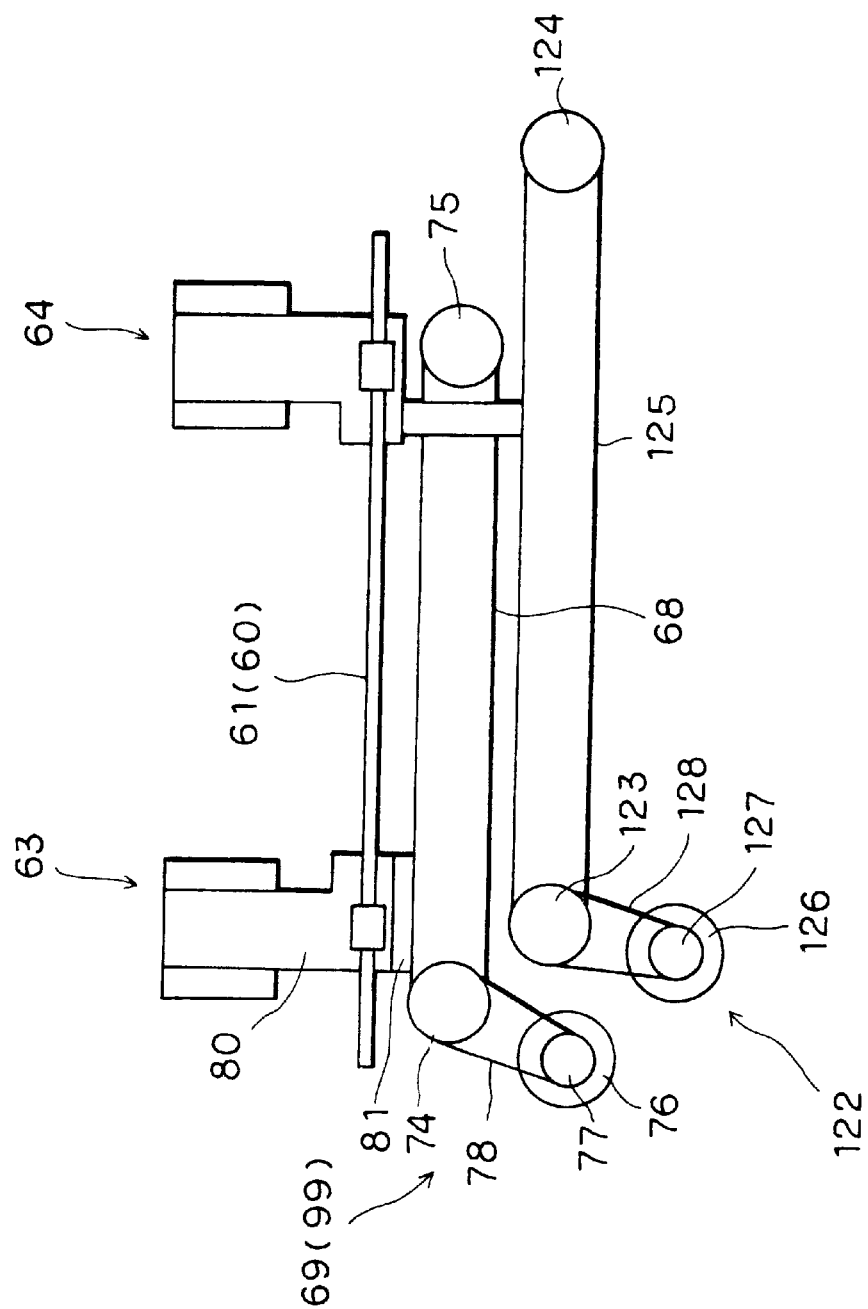
FIG. 6 is a schematic diagram for explaining the structure of a reciprocal traveling mechanism.
Figure 9:
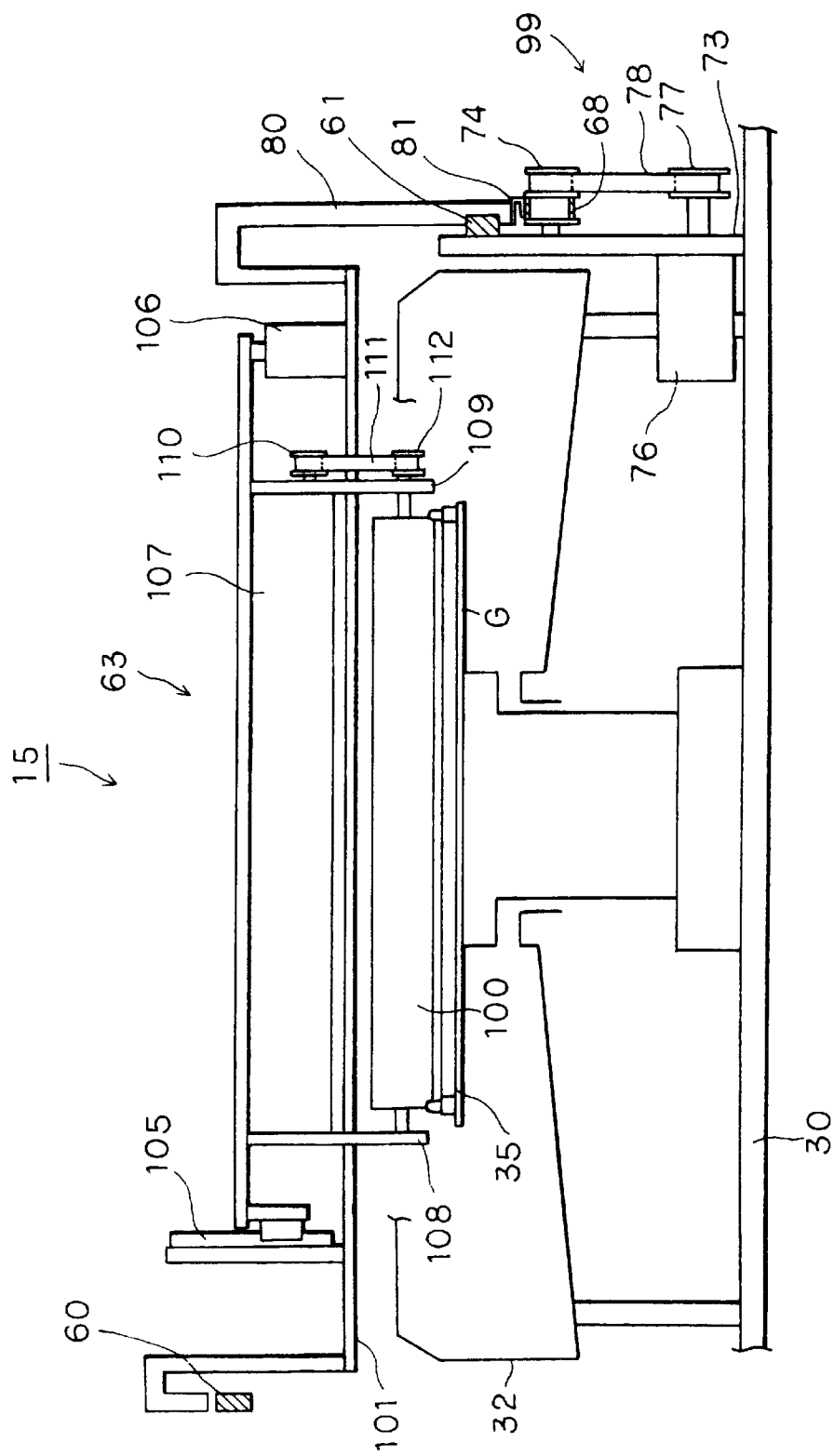
FIG. 9 is a left side view showing a cleaning unit having a scrubber cleaning means with a roll brush for cleaning the front surface of a substrate according to another embodiment of the present invention.

FIG. 9 is a left side view showing the structure of a cleaning unit 15 having a scrubber cleaning means 63 with one roll brush. The cleaning unit 15 cleans the front surface of the substrate G with the roll brush. As with the structure shown in FIG. 5, a traveling member 101 that traverses a cup 32 is reciprocally moved along guides 60 and 61. A reciprocal traveling mechanism 99 is disposed in the vicinity of the guide 61. The reciprocal traveling mechanism 99 causes the traveling member 101 to travel along the guides 60 and 61. The structure of the reciprocal traveling mechanism 99 is the same as the reciprocal traveling mechanism 69 shown in FIGS. 5 and 6. For simplicity, in the reciprocal traveling mechanism 99 shown in FIG. 9, similar portions to those in the reciprocal traveling mechanism 69 shown in FIGS. 5 and 6 are denoted by similar reference numerals and their description will be omitted.

A vertical guide 105 and a cylinder 106 are disposed on the upper surface of the traveling member 101. Both sides of a scrubber main body 107 are held by the vertical guide 105 and the cylinder 106. A roll brush 100 is disposed below the scrubber main body 107. The roll brush 100 is rotatably held between the plates 108 and 109. The roll brush 100 is rotated by the rotational force of a motor disposed in the scrubber main body 107 through a pulley 110, a belt 111, and a pulley 112. When the cylinder 106 is shrunk, the scrubber main body 107 is lowered. Thus, the roll brush 100 contacts the front surface of the substrate G held on the upper surface of a spindle chuck portion 35 in a cup 32. As with the structure shown in FIG. 5, when a scrubber cleaning means 63 is moved from the standby position to the inside of the cup 32 or vice versa, the cylinder 106 is extended and thereby the scrubber main body 107 is raised. Thus, the roll brush 100 is raised to a position higher than the opening portion of the cup 32.

When the front surface of the substrate G is cleaned, the cylinder 106 is shrunk and thereby the scrubber main body 107 is lowered. Thus, in the state in which the roll brush 100 traverses and contacts the front surface of the substrate G, while the roll brush 100 is rotated, the motor 76 is rotated forward and backward. Consequently, the scrubber cleaning means 63 is reciprocally moved along the guides 60 and 61. As a result, the entire front surface of the substrate G is cleaned.

Figure 10:
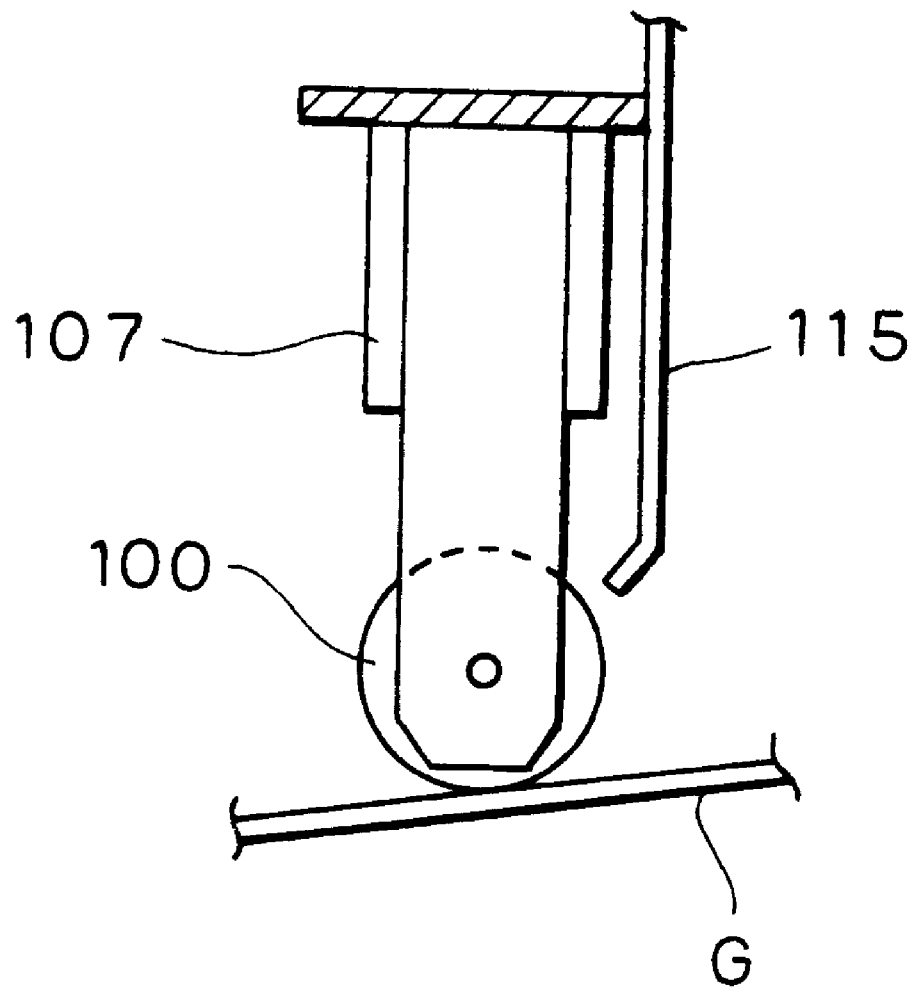
FIG. 10 is a side view showing the structure of a scrubber main body according to the embodiment shown in FIG. 9.

As shown in FIG. 10, a nozzle 115 is disposed on one side of the scrubber main body 107. When the roll brush 100 is rotated, a cleaning solution such as pure water is sprayed from the nozzle 115. Thus, the cleaning solution is supplied to the front surface of the substrate G.

In the embodiment shown in FIGS. 9 and 10, one roll brush 100 is disposed. Alternatively, a plurality of roll brushes 100 may be disposed in parallel with the substrate G.

Figure 11:
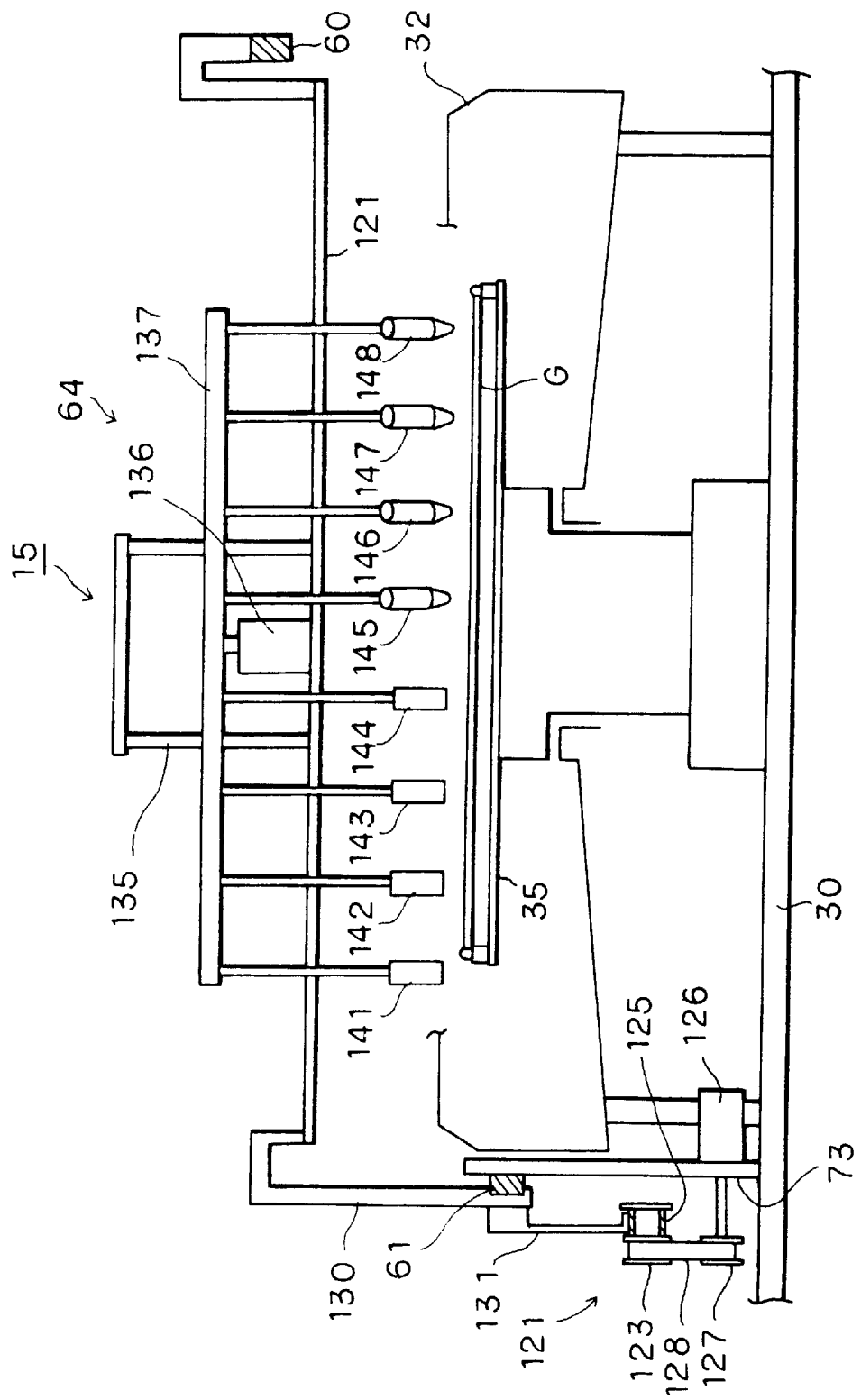
FIG. 11 is a right side view showing a cleaning unit for explaining a nozzle cleaning means.

FIG. 11 is a left side view showing the structure of the cleaning unit 15. With reference to the cleaning unit 15, a nozzle cleaning means 64 as a processing solution supplying mechanism will be described. As with the scrubber cleaning means 63 shown in FIGS. 5 and 9, a traveling member 121 traverses a cup 32. The traveling member 121 is held by guides 60 and 61 disposed on both sides of a cup 32 so that the traveling member 121 is reciprocally moved. A reciprocal traveling mechanism 122 is disposed in the vicinity of the guide 61. The reciprocal traveling member 121 causes the traveling member 121 to travel along the guides 60 and 61. In other words, the reciprocal traveling mechanism 122 has a two-staged pulley 123 and an endless belt 125. The two-staged pulley 123 is disposed on a holding member 73. The holding member 73 is disposed on a table 30. The endless belt 125 is wound around a pulley 124 shown in FIG. 6. Rotating force of a motor 126 is transmitted to the endless belt 125 through a pulley 127, a belt 128, and the two-staged pulley 123. As shown in FIG. 11, the traveling member 121 is connected to the upper surface of the endless belt 125 through a connecting member 130 and a bracket 131. Thus, when the motor 126 is rotated forward and backward, the entire nozzle cleaning means 64 is reciprocally moved along the guide 60 and 61.

A vertical guide 135 and a cylinder 136 are disposed on the upper surface of the traveling member 121. A nozzle holding member 137 is raised and lowered by the cylinder 136 along the vertical guide 135. A plurality of nozzles 141, 142, 143, 144, 145,146, 147, and 148 as mechanisms that supply a different types of processing solution (for example, cleaning solution) to the front surface of the substrate G are disposed on the lower surface of the nozzle holding member 137. In the example shown in FIG. 11, the nozzles 141 to 144 disposed above one radius portion of the front surface of the substrate G are jet nozzles as first processing solution supplying mechanisms that supply a cleaning solution pressured at 30 to 70 kg/cm$^2$ to the front surface of the substrate G. The nozzles 145 to 148 disposed above the other radius portion of the front surface of the substrate are mega-sonic nozzles as a second processing solution supplying mechanisms that supply a cleaning solution ultrasonically vibrated at around 1 MHz. The cylinder 136 is shrunk and thereby the nozzle holding portion 137 is lowered. Thus, the nozzles 141 to 148 are lowered to a position at which cleaning solution is supplied to the front surface of the substrate G held on the upper surface of the spin chuck portion 35 in the cup 32. FIG. 11 shows a state in which after the cylinder 136 is shrunk and thereby the nozzle holding member 137 is lowered, the nozzles 141 to 148 are lowered to a position close to the front surface of the substrate G. As will be described later, when the nozzle cleaning means 64 is moved from the standby position to the inside of the cup 32 or vice versa, the cylinder 136 is extended and thereby the nozzle holding member 137 is raised. Thus, the nozzles 141 to 148 are raised to a position higher than the opening portion of the cup 32.

When the front surface of the substrate G is cleaned, the cylinder 136 is shrunk and thereby the nozzle holding member 137 is lowered. Thus, the nozzles 141 to 148 are lowered to a position close to the front surface of the substrate G. In this state, the nozzles 141 to 144 supply pressured cleaning solution. In addition, the nozzles 145 to 148 supply an ultrasonically vibrated cleaning solution. In addition, the motor 42 shown in FIG. 2 is rotated and thereby the spin chuck portion 35 is rotated. Thus, the substrate G is rotated in the clockwise direction CW (viewed from the top of the drawing shown in FIG. 12). When the motor 126 is rotated forward and backward, the nozzle cleaning means 64 is reciprocally moved along the guides 60 and 61. Thus, the entire front surface of the substrate G is cleaned. When the front surface of the substrate G is cleaned by the nozzle cleaning means 64, the motor 42 rotates the spin chuck portion 35. Thus, when the nozzle cleaning means 64 is reciprocally moved from the outer periphery of the substrate G to the center thereof, the entire front surface of the substrate G can be cleaned.

Figure 12:
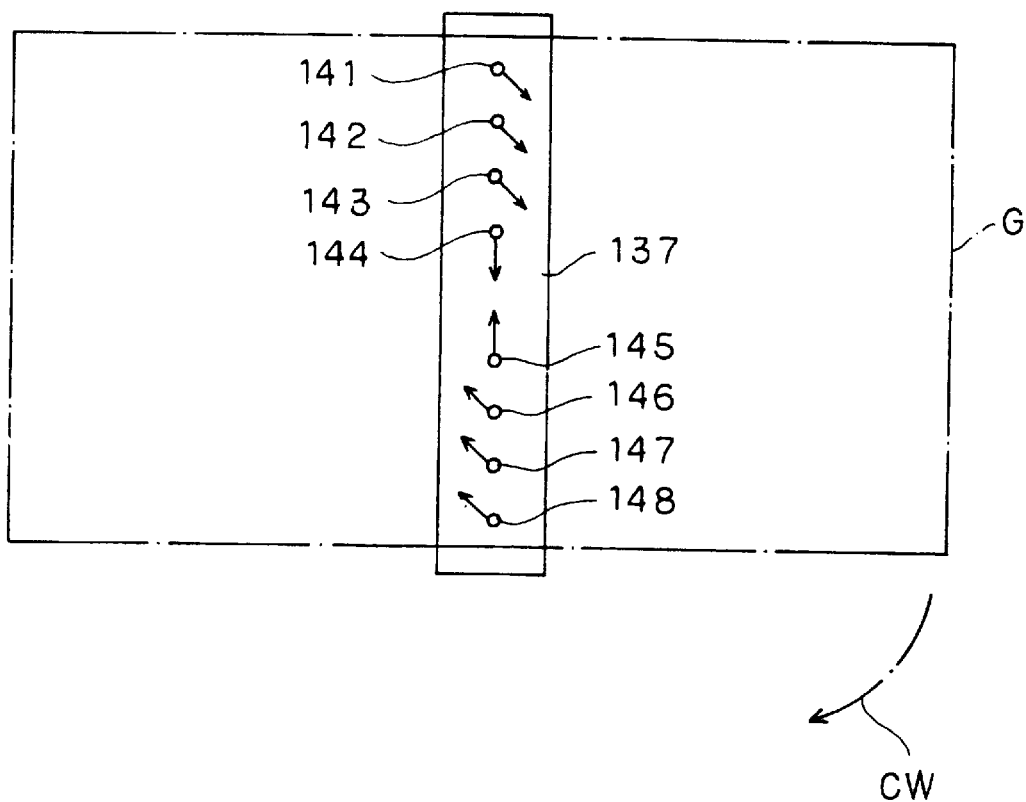
FIG. 12 is a schematic diagram for explaining the orientations of nozzles of the nozzle cleaning means.

The orientations of the nozzles 141 to 148 disposed below the nozzle holding member 137 can be varied. In this embodiment, as shown in FIG. 12, the nozzle 144 disposed at the innermost position of the jet nozzles orients to the center direction of the front surface of the substrate G held by the spin chuck portion 35. The other three nozzles 141 to 143 orient to the rotating direction CW of the substrate G. Likewise, the nozzle 145 disposed at the innermost position of the mega-sonic nozzles orients to the center direction of the front surface of the substrate G held by the spin chuck portion 35. The other three nozzle 146 to 148 orient to the rotating direction CW of the substrate G.

Next, the operation of the cleaning unit 15 according to the embodiment of the present invention will be described.

The conveying arm 8 of the resist processing system 1 shown in FIG. 1 loads a substrate G to the cleaning unit 15. The lifting portion 37 shown in FIG. 2 is raised. Thus, the substrate G held by the conveying arm 8 is raised and transferred to the lifting portion 37. After the conveying arm 8 exits from the cleaning unit 15, the lifting portion 37 is lowered. Thus, the substrate G is held in such a manner that the substrate G is aligned with the pins 40 on the upper surface of the spin chuck portion 35.

Thereafter, the scrubber cleaning means 63 shown in FIGS. 5 and 9 cleans the front surface of the substrate G.

When the front surface of the substrate G is cleaned by the scrubber cleaning means 63 having the disc brushes 70 shown in FIG. 5, the reciprocal traveling mechanism 69 reciprocally moves the scrubber cleaning means 63 to an upper position of the cup 32. The cylinder 86 is shrunk and thereby the scrubber main body 87 is lowered. Thus, the disc brushes 70 contact the front surface of the substrate G at a predetermined pressure in such a manner that the disc brushes 70 are kept in parallel with the front surface of the substrate G. While the disc brushes 70 are rotated, the reciprocal traveling mechanism 69 reciprocally moves the scrubber cleaning means 63 along the guides 60 and 61. The scrubber cleaning means 63 is reciprocally moved from one peripheral edge of the front surface of the substrate G to the other peripheral edge thereof in such a manner that the scrubber cleaning means 63 is kept in parallel with the front surface of the substrate G. Thus, the entire front surface of the substrate G can be cleaned. After the disc brushes 70 have cleaned the front surface of the substrate G, the cylinder 86 is extended and thereby the scrubber main body 87 is raised. Thus, the reciprocal traveling mechanism 69 returns the scrubber cleaning means 63 to the standby position that is outside the cup 32.

When the front surface of the substrate G is cleaned by the scrubber cleaning means 63 having the roll brush 100 shown in FIG. 9, the reciprocal traveling mechanism 99 causes the scrubber cleaning means 63 to travel to an upper position of the cup 32. The cylinder 106 is shrunk and thereby the scrubber main body 107 is lowered. Thus, the roll brush 100 contacts the front surface of the substrate G at a predetermined pressure in such a manner that the roll brush 100 is kept in parallel with the front surface of the substrate G. While the roll brush 100 is rotated, the reciprocal traveling mechanism 99 causes the scrubber cleaning means 63 to travel along the guides 60 and 61. The scrubber cleaning means 63 is reciprocally moved from one peripheral edge of the front surface of the substrate G to the other peripheral edge thereof in such a manner that the scrubber cleaning means 63 is kept in parallel with the front surface of the substrate G. Thus, the entire front surface of the substrate G is cleaned. After the roll brush 100 has cleaned the front surface of the substrate G, the cylinder 106 is extended and thereby the scrubber main body 107 is raised. The reciprocal traveling mechanism 99 causes the scrubber cleaning means 63 to return to the standby position that is outside the cup 32 (at step A).

Thereafter, the nozzle cleaning means 64 shown in FIG. 11 cleans the front surface of the substrate G. In other words, the reciprocal traveling mechanism 122 causes the nozzle cleaning means to travel to an upper position of the cup 32.

The cylinder 136 is shrunk and thereby the nozzle holding member 137 is lowered. The nozzles 141 to 148 are lowered to a position close to the front surface of the substrate G in such a manner that the nozzles 141 to 148 are kept in parallel with the front surface of the substrate G. The nozzles 141 to 144 supply a pressured cleaning solution. The nozzles 145 to 148 supply an ultrasonically vibrated cleaning solution. The operation of the nozzles 141 to 144 and the operation of the nozzles 145 to 148 can be properly designated. After one of two nozzle sets is operated, the other nozzle set may be operated. Alternatively, after the operation of one of two nozzle sets is stopped, the operation of the other nozzle set may be stopped. As another alternative method, the operation start time of one of the nozzle sets may match the operation stop time of the other nozzle set.

In addition, the spin chuck portion 35 is rotated at a first rotational speed. The substrate G is rotated in the clockwise direction CW. The reciprocal traveling mechanism 122 causes the nozzle cleaning means 64 to reciprocally travel from one peripheral edge of the front surface of the substrate G to the other peripheral edge thereof along the guides 60 and 61 in such a manner that the nozzle cleaning means 64 is kept in parallel with the front surface of the substrate G. Thus, with the supplied cleaning solution supplied, the entire front surface of the substrate G is cleaned. In this case, since the substrate G is rotated, it is not necessary to reciprocally move the nozzle cleaning means 64 from the one peripheral edge of the front surface of the substrate G to the other peripheral edge thereof. In other words, when the nozzle cleaning means 64 is reciprocally moved from one peripheral edge to the center, the entire front surface of the substrate G can be cleaned. After the front surface of the substrate G has been cleaned, the cylinder 136 is extended and thereby the nozzle holding member 137 is raised. Thus, the reciprocal traveling mechanism 122 causes the nozzle cleaning means 64 to return to the standby position that is outside the cup 32.

While the front surface of the substrate G is cleaned by the nozzle cleaning means 64, the rear surface of the substrate G held by the spin check portion 35 is cleaned with the cleaning solution sprayed from the nozzles 50 and 51 shown in FIG. 5.

The operation of the nozzle 50 and the operation of the nozzle 51 can be properly designated. After one of the nozzles is operated, the other nozzle may be operated. Alternatively, after the operation of one of the nozzles is stopped, the operation of the other nozzle may be stopped. As another alternative method, the operation start time of one of the nozzles may match the operation end time of the other nozzle (at step B).

After the substrate G has been cleaned, a drying process C for the substrate G is performed. The rotational speed of the motor 42 shown in FIG. 2 is increased. Thus, the substrate G held by the spin chuck portion 35 is rotated at a second rotational speed that is faster than the first rotating speed. Thus, the cleaning solution that adheres to the front surface of the substrate G is scattered by centrifugal force. Consequently, the substrate G is dried in a short time. While the substrate G is rotated at high speed, the nozzle 52 shown in FIG. 5 sprays drying gas from the peripheral direction of the substrate G to the center thereof so as to dry the rear surface of the substrate G held by the spin chuck portion 3 (at step C).

After the substrate G has been cleaned and dried, the rotation of the motor 42 is stopped. The lifting portion 37 is raised and thereby the substrate G held by the spin chuck portion 35 is raised. After the conveying arm 8 of the resist processing system 1 enters the cleaning unit 15, the lifting portion 37 is lowered. Thus, the substrate G is transferred to the conveying arm 8. The conveying arm 8 conveys the substrate G to the next processing unit of the resist processing system 1.

In the cleaning unit 15 according to the embodiment, since the nozzle cleaning means 63 and the scrubber cleaning means 64 are held on both sides thereof by the guides 60 and 61, the strength of the cleaning unit 15 is higher than that of the conventional cleaning unit that is held on one side thereof. Thus, the sizes of the nozzle cleaning means 64 and the scrubber cleaning means can be increased corresponding to large glass substrates. In addition, the cleaning area can be widened. In the above-described embodiments, the cleaning unit 15 that cleans LCD glass substrates G was described. However, the present invention can be applied to other cleaning units that clean other substrates such as semiconductor wafers and printed circuit boards.

In addition, since the nozzle cleaning means 64 and the scrubber cleaning means 63 are held on both sides thereof by the guide means 60 and 61 through the holding means 33, the strength of the cleaning unit according to the present invention is higher than the strength of the conventional cleaning unit that holds an arm on one side thereof. Thus, the sizes of the nozzle cleaning means 64 and the scrubber cleaning means 63 can be increased corresponding to large glass substrates. Consequently, the cleaning area can be widened.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A cleaner that cleans a substrate, comprising:
    a chuck that horizontally holds and rotates the substrate;
    a first cleaner having at least one scrubber that cleans an upper surface of the substrate held on said chuck;
    a first transporter includes a pair of parallel guides fixedly provided on opposite sides of said chuck that extends in a predetermined direction, a first traveler that supports said first cleaner thereon and supported on said guides, and a first driver connected to said first traveler that reciprocally moves the first traveler and the first cleaner;
    a second cleaner having a processing solution supply that supplies different types of processing solution to the upper surface of the substrate; and
    a second transporter including a second guide fixedly provided on opposite sides of said chuck so as to extend in said predetermined direction, a second traveler that supports said second cleaner thereon and supported on said second guide, and a second driver connected to said second traveler that reciprocally moves the second traveler and the second cleaner.

2. The cleaning unit as set forth in claim 1,
    wherein said first cleaner moves between a processing position above the substrate and a first standby position, and said second cleaner moves between said processing position and a second standby position.

3. The cleaning unit as set forth in claim 2,
    wherein said first and second standby positions are on opposite sides of said processing position.

4. The cleaning unit as set forth in claim 1,
wherein said scrubber of the first transporter is a disk brush.

5. The cleaning unit as set forth in claim 1,
wherein said scrubber of the first transporter is a roll brush.

6. The cleaning unit as set forth in claim 1,
wherein said processing solution supply includes at least one first nozzle that supplies a pressurized cleaning solution to the upper surface of the substrate, and at least one second nozzle that supplies an ultrasonically vibrated cleaning solution to the upper surface of the substrate.

7. The cleaning unit as set forth in claim 6,
wherein a plural number of said first nozzle and a plural number of said second nozzle are disposed on opposite sides of a center area of the substrate held by the chuck.

8. The cleaning unit as set forth in claim 7,
wherein at least one of said plural number of the first nozzle is disposed to spray the cleaning solution in a rotating direction of the substrate, and at least one of said plural number of the second nozzle is disposed to spray the cleaning solution in a rotating direction of the substrate, and
wherein at least another one of said plural number of the first nozzle is disposed to spray the cleaning solution in a direction toward a center area of the substrate, and at least another one of said plural number of the second nozzle is disposed to spray the cleaning solution in a directing toward the center area of the substrate.

9. The cleaning unit as set forth in claim 1,
wherein said first driver includes a first endless belt drive.

10. The cleaning unit as set forth in claim 9,
wherein said first endless belt drive is connected to said first traveler through a first connector.

11. The cleaning unit as set forth in claim 1,
wherein said second driver includes a second endless belt drive.

12. The cleaning unit as set forth in claim 11,
wherein said second endless belt drive is connected to said second traveler through a second connector.

13. The cleansing unit as set forth in claim 1, further comprising:
a rear surface processing solution supply provided below the substrate held by the chuck that selectively supplies different types of processing solution to a rear surface of the substrate.

14. The cleaning unit as set forth in claim 13,
wherein said rear surface processing solution supply includes a plurality of supply nozzles that supply the different types of processing solution, respectively.

15. The cleaning unit as set forth in claim 14,
wherein at least one of said supply nozzles is disposed to spray the processing solution in a rotating direction of the substrate, and at least another one of said supply nozzles is disposed to spray the processing solution in a direction toward a center area of the substrate.

16. The cleaning unit as set forth in claim 1, further comprising:
a gas supply that supplies a gas to a rear surface of the substrate held by the chuck.

17. The cleaning unit as set forth in claim 16,
wherein said gas supply supplies the gas in a direction from peripheral edge of the substrate to a center area of the substrate.

18. The cleaning unit as set forth in claim 1,
wherein said first cleaner is supported on said first traveler and is movable toward and away from the substrate held by the chuck.

19. The cleaning unit as set forth in claim 1,
wherein said second cleaner is supported on said second traveler and is movable toward and away from the substrate held by the chuck.

20. A method of cleaning a substrate, comprising the steps of:
(a) holding a substrate rotatably and horizontally on a holding mechanism with a surface thereof facing upward;
(b) moving first cleaning means having at least one cleaning member in a predetermined direction along parallel guides provided on opposite sides of the holding mechanism and over said substrate held by the holding mechanism and causing the cleaning member to be brought in to pressed contact with upwardly facing surface of the substrate to clean the surface; and
(c) moving second cleaning means having processing solution supplying members for supplying different types of processing solutions, in said predetermined direction along said parallel guides and over said substrate held by the holding mechanism and supplying said different types of the processing solutions onto the upwardly facing surface of the substrate to secondarily clean the surface of the substrate.

21. The method as set forth in claim 20,
wherein said step (b) is performed by reciprocatingly moving the cleaning member from a position on a peripheral edge of the substrate to another position on the peripheral edge of the substrate, and
wherein said step (c) is performed by reciprocatingly moving the processing solution supplying members from a position on a peripheral edge of the subs ate to another position on the peripheral edge of the substrate.

22. The method as set forth in claim 20,
wherein said step (b) is performed while the substrate is held stationary; and
wherein said step (c) is performed while the substrate is rotated.

23. The method as set forth in claim 20,
wherein one of said different types of processing solution is a pressurized cleaning solution and another of said different types of the processing solutions is an ultrasonically vibrated processing solution.

24. The method as set forth in claim 22, further comprising the steps of:
(d) after said step (c), rotating the substrate at a rotational speed higher than a rotational speed at which the substrate is rotated in the step (c); and
(e) supplying a gas to a rear surface of the substrate held by the holding mechanism from a position on a peripheral edge of the substrate to a central area of the substrate, to dry the rear surface of the substrate.

25. The method as set forth in claim 20,
wherein said step (c) is performed by selectively supplying one of the different types of processing solution to the major surface of the substrate.

* * * * *